United States Patent
Schick et al.

(10) Patent No.: US 9,222,648 B2
(45) Date of Patent: Dec. 29, 2015

(54) BROAD-AREA LIGHTING SYSTEMS

(71) Applicant: CoolEdge Lighting, Inc., Burnaby (CA)

(72) Inventors: Philippe M. Schick, British Columbia (CA); Michael A. Tischler, Scottsdale, AZ (US)

(73) Assignee: Cooledge Lighting, Inc., Richmond (CA)

( * ) Notice: Subject to any disclaimer, the term of this patent is extended or adjusted under 35 U.S.C. 154(b) by 520 days.

(21) Appl. No.: 13/664,743

(22) Filed: Oct. 31, 2012

(65) Prior Publication Data
US 2013/0114255 A1   May 9, 2013

Related U.S. Application Data

(60) Provisional application No. 61/555,035, filed on Nov. 3, 2011, provisional application No. 61/589,908, filed on Jan. 24, 2012.

(51) Int. Cl.
| | |
|---|---|
| F21V 5/00 | (2015.01) |
| F21V 11/00 | (2015.01) |
| F21V 17/00 | (2006.01) |
| H01L 25/075 | (2006.01) |
| H05K 1/02 | (2006.01) |
| H05K 1/18 | (2006.01) |
| F21K 99/00 | (2010.01) |
| F21Y 105/00 | (2006.01) |
| F21Y 101/02 | (2006.01) |
| H01L 33/58 | (2010.01) |
| H01L 33/62 | (2010.01) |

(52) U.S. Cl.
CPC ............... *F21V 11/00* (2013.01); *F21V 5/007* (2013.01); *F21V 17/00* (2013.01); *H01L 25/0753* (2013.01); *H05K 1/0274* (2013.01); *H05K 1/181* (2013.01); *F21K 9/90* (2013.01); *F21Y 2101/02* (2013.01); *F21Y 2105/001* (2013.01); *H01L 33/58* (2013.01); *H01L 33/62* (2013.01); *H01L 2924/0002* (2013.01); *H05K 2201/10106* (2013.01); *Y10T 29/49002* (2015.01); *Y10T 29/49124* (2015.01); *Y10T 29/49227* (2015.01)

(58) Field of Classification Search
CPC ............ H01L 2924/00; H01L 33/62; H01L 2924/0002; H01L 33/58; F21K 9/90; F21V 11/00; F21V 17/00; F21V 5/007; H05K 2201/10106; H05K 1/0274; H05K 1/181; H02L 25/0753; Y10T 29/49002; Y10T 29/49124; Y10T 29/49227; F21Y 2105/001; F21Y 2101/02
USPC ........................................... 362/612, 84, 800
See application file for complete search history.

(56) References Cited

U.S. PATENT DOCUMENTS 5,661,371 A * 8/1997 Salerno et al. ............. 315/169.3

* cited by examiner

*Primary Examiner* — Sharon Payne
(74) *Attorney, Agent, or Firm* — Morgan, Lewis & Bockius LLP

(57) ABSTRACT

In accordance with certain embodiments, thermal stresses are mitigated in illumination systems by mating optical substrates with a plurality of discrete substrates each having one or more light-emitting elements thereon.

20 Claims, 8 Drawing Sheets

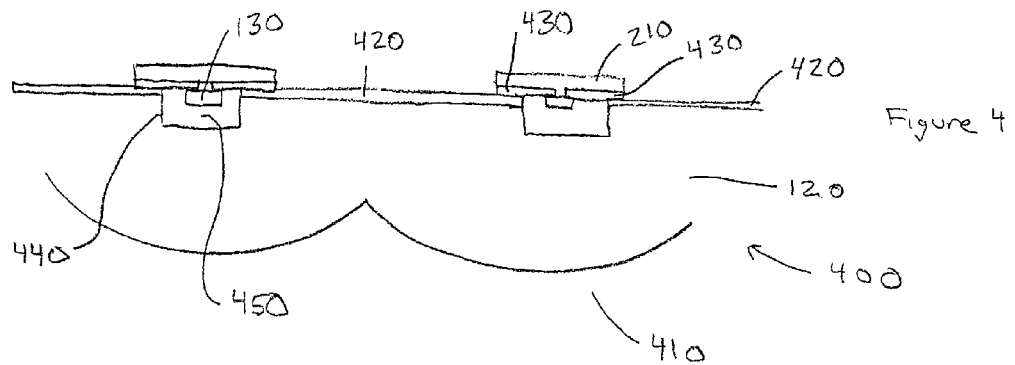
Figure 4
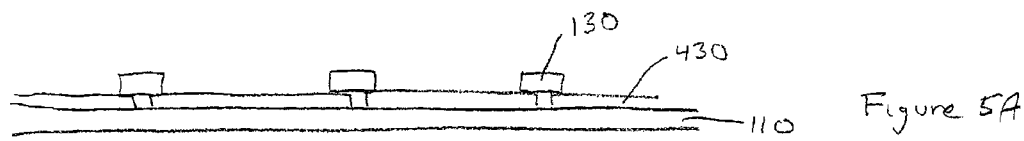
Figure 5A
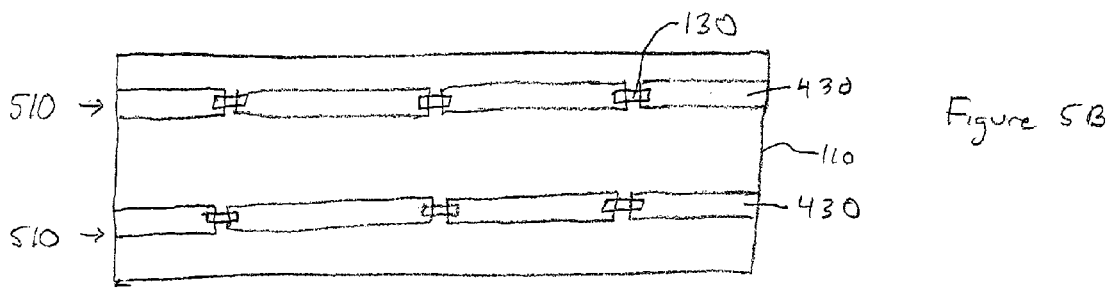
Figure 5B
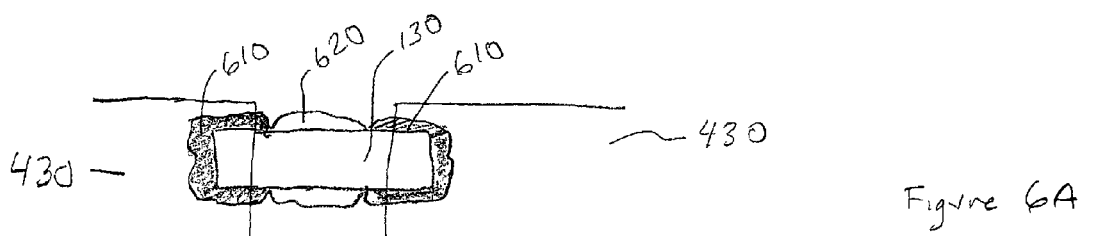
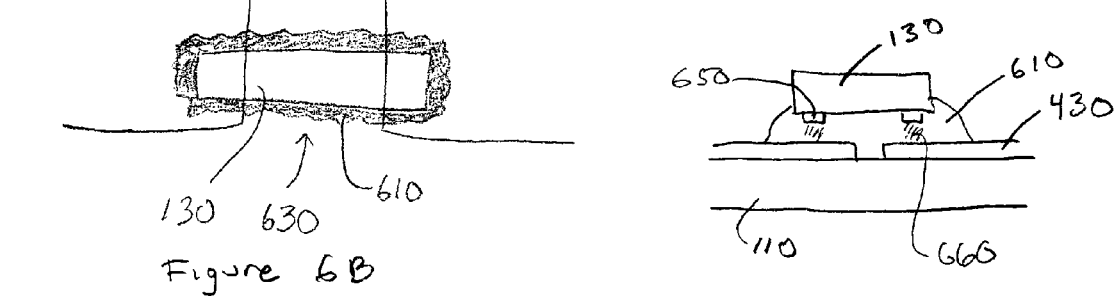
Figure 6A
Figure 6B

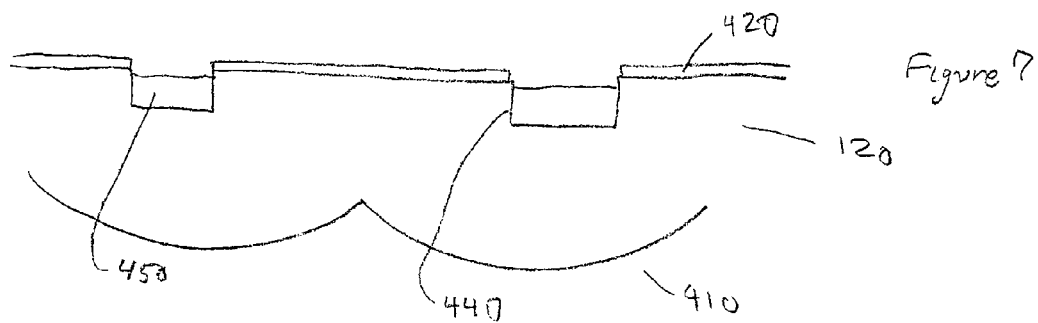
Figure 7
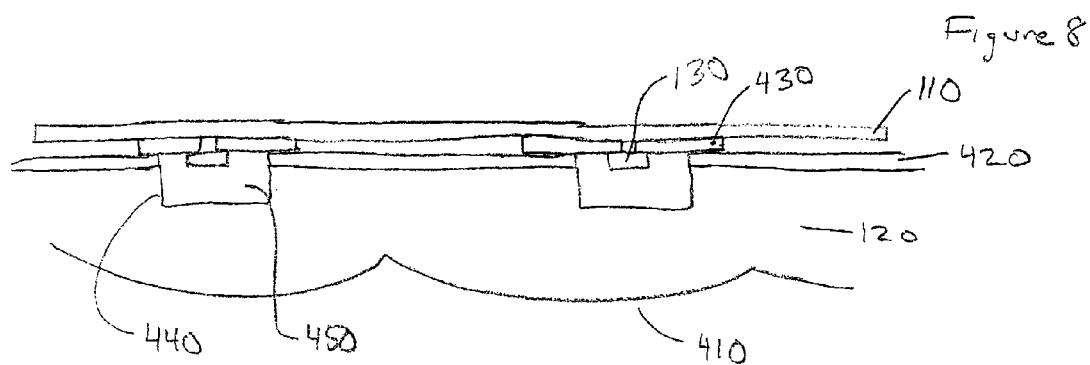
Figure 8
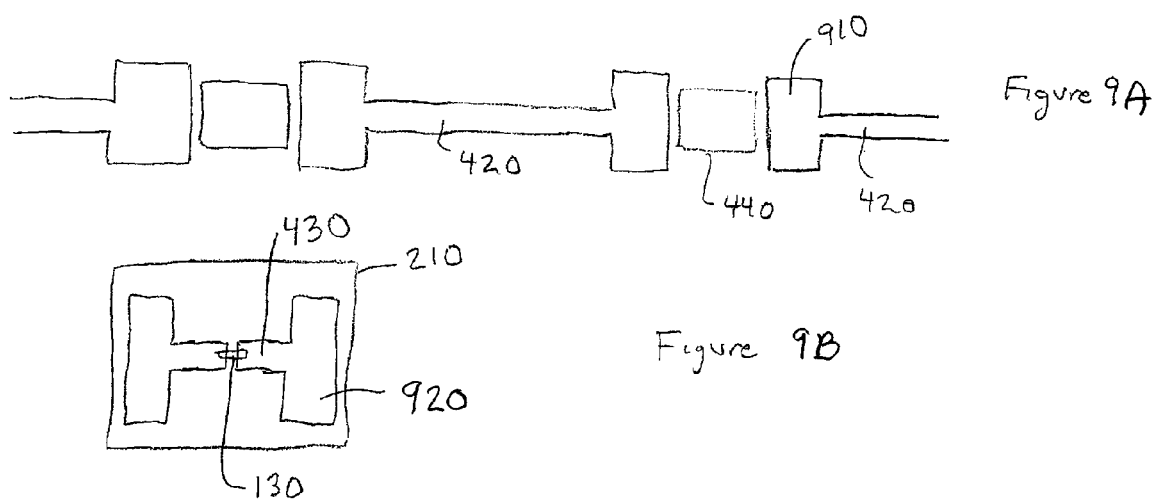
Figure 9A
Figure 9B

BROAD-AREA LIGHTING SYSTEMS

RELATED APPLICATIONS

This application claims the benefit of and priority to U.S. Provisional Patent Application No. 61/555,035, filed Nov. 3, 2011, and U.S. Provisional Patent Application No. 61/589,908, filed Jan. 24, 2012, the entire disclosure of each of which is hereby incorporated herein by reference.

FIELD OF THE INVENTION

In various embodiments, the present invention generally relates to electronic devices, and more specifically to array-based electronic devices.

BACKGROUND

Light sources such as light-emitting diodes (LEDs) are an attractive alternative to incandescent and fluorescent light bulbs in illumination devices due to their higher efficiency, smaller form factor, longer lifetime, and enhanced mechanical robustness. However, the high cost of LEDs and associated heat-sinking and thermal-management systems have limited the widespread utilization of LEDs, particularly in broad-area general lighting applications.

The high cost of LED-based lighting systems has several contributors. LEDs are typically encased in a package, and multiple packaged LEDs are used in each lighting system to achieve the desired light intensity. In order to reduce costs, LED manufacturers have developed high-power LEDs that emit relatively higher light intensities by operating at higher currents. While reducing the package count, these LEDs require higher-cost packages to accommodate the higher current levels and to manage the significantly higher resulting heat levels. The higher heat loads and currents, in turn, typically require more expensive thermal-management and heat-sinking systems which also add to the cost (as well as to the size) of the system. Higher operating temperatures may also lead to shorter lifetimes and reduced reliability. Finally, LED efficacy typically decreases with increasing drive current, so operation of LEDs at higher currents generally results in a reduction in efficacy when compared to lower-current operation.

A further problem associated with using fewer high-power LEDs in broad-area lighting—for example, to replace fluorescent lighting systems—is that the light must be expanded from the relatively small area of the die (on the order of 1 mm$^2$) to emit over a relatively large area (on the order of 1 ft$^2$ or larger). Such expansion often results in decreased efficiency, reduced performance, and increased cost. For example, a light panel may be edge-lit and incorporate features that redirect or scatter light. However, it is often difficult to achieve uniform light intensity over the entire emitting area of such panels, with the intensity generally being higher at the edge(s) near the light sources. Also, the emission pattern from such devices is typically Lambertian, resulting in poor utilization of light and relatively high glare.

An alternate approach to producing broad-area lighting is to use a large array of small LEDs positioned over the desired emitting area. Such LEDs may be unpackaged LEDs (i.e., LED dies) or packaged within, e.g., a leadframe and polymeric encapsulation. A large array tends to reduce the cost and efficiency losses associated with optics required to spread out light from a small number of high-power LEDs.

The materials used for the various components of the complete lighting package are often dissimilar and often have different thermal coefficients of expansion (TCEs). This may cause problems during the manufacture of the lighting system, for example, during processing steps involving heating or cooling (e.g., soldering, curing of adhesives and/or encapsulants, etc.), or in the field, either from ambient-induced temperature changes or from self-heating and cooling upon power-cycling of the system.

FIG. 1 shows a system 100 featuring a light-emitter substrate 110, an optical substrate 120, an LED 130, and a region 140. Region 140 may be empty or may include a transparent material or a transparent material in combination with a light-conversion material, such as a phosphor. Light-emitter substrate 110 and optical substrate 120 may be different materials and have different TCEs. When this structure is heated and cooled, stresses will generally develop that may result in cracking of one or both substrates or partial or full delamination of one substrate from the other. Stress-induced changes to the electrical connections to LED 130 can cause intermittent connections or open-circuits or short-circuits.

In view of the foregoing, a need exists for systems and procedures enabling the uniform and economical integration of arrays of low-cost light sources (such as LEDs), phosphors, and optical elements, as well as lighting systems based thereon, which minimize TCE-induced problems.

SUMMARY

In accordance with certain embodiments, illumination devices (which are preferably planar) feature a plurality of light-emitting elements electrically connected in series, parallel, or in series/parallel fashion. The light-emitting elements may have light-conversion materials such as phosphors disposed over and/or around them, and may also be associated with (e.g., aligned to) optical elements (e.g., lenses) disposed on or forming portions of an overlying optical substrate. (An optical substrate comprising a plurality of optical elements is preferably a unitary substrate having the optical elements formed therein or thereon.) Herein, two components such as light-emitting elements, optical elements, and/or other portions of lightsheets or optical substrates (e.g., holes or wells (i.e., depressions or other recessed regions)) being "aligned" may refer to such components being mechanically and/or optically aligned. By "mechanically aligned" is meant coaxial or situated along a parallel axis. By "optically aligned" is meant that at least some light (or other electromagnetic signal) emitted by or passing through one component passes through and/or is emitted by the other. In order to enhance reliability and reduce thermally induced stresses, the light-emitting elements preferably are disposed on substrates having vastly smaller areas than that of an optical substrate to which they are attached. Thus, the different TCEs of the light-emitting elements and the optical substrate result in only minimal amounts of deleterious thermal stress.

In preferred embodiments, the integration of the light-conversion material and/or the optical elements with the light-emitting elements is repeatably and uniformly performed in parallel. For example, a substrate having the light-emitting elements disposed thereon (i.e., a "lightsheet") may be directly bonded to the optical substrate, the light-emitting elements having been positioned for alignment with the optical elements of the optical substrate, and then the lightsheet may be separated into multiple smaller substrates each supporting one or more of the light-emitting elements. Alternatively, the light-emitting elements may initially be provided on small (e.g., having areas at least 100 times, or even 1000 times, smaller than that of the optical substrate) substrates that are attached to the optical substrate.

As utilized herein, an "optical substrate" is a material for receiving, manipulating, and/or transmitting light. An optical substrate may include or consist essentially of, e.g., a transparent or translucent sheet or plate, a waveguide and/or one or more (even an array of) optical elements such as lenses. For example, optical elements may include or consist essentially of refractive optics, reflective optics, Fresnel optics, total internal reflection optics, and the like. The optical substrate may include features or additional components or materials to scatter, reflect, or absorb light or a portion of light in the optical substrate, and it may confine light by total internal reflection prior to its emission from the optical substrate.

As utilized herein, the term "light-emitting element" (LEE) refers to any device that emits electromagnetic radiation within a wavelength regime of interest, for example, visible, infrared or ultraviolet regime, when activated, by applying a potential difference across the device or passing a current through the device. Examples of light-emitting elements include solid-state, organic, polymer, phosphor-coated or high-flux LEDs (bare-die or packaged), microLEDs, laser diodes or other similar devices as would be readily understood. The emitted radiation of a LEE may be visible, such as red, blue or green, or invisible, such as infrared or ultraviolet, and may have a single wavelength or a spread of wavelengths. A LEE may feature a phosphorescent or fluorescent material for converting a portion of its emissions from one set of wavelengths to another. A LEE may include multiple constituent LEEs, each emitting at essentially the same or different wavelength(s). In some embodiments, a LEE is an LED that may feature a reflector over all or a portion of its surface upon which electrical contacts are positioned. The reflector may also be formed over all or a portion of the contacts themselves. In some embodiments, the contacts are themselves reflective.

A LEE may be of any size. In some embodiments, a LEEs has one lateral dimension less than 500 µm. Exemplary sizes of a LEE may include about 250 µm by about 600 µm, about 250 µm by about 400 µm, about 250 µm by about 300 µm, or about 225 µm by about 175 µm. In some embodiments, a LEE includes or consists essentially of a small LED die, also referred to as a "microLED." A microLED generally has one lateral dimension less than about 300 µm. In some embodiments, the LEE has one lateral dimension less than about 200 µm or even less than about 100 µm. For example, a microLED may have a size of about 225 µm by about 175 µm or about 150 µm by about 100 µm or about 150 µm by about 50 µm. In some embodiments, the surface area of the top surface of a microLED is less than 50,000 µm$^2$ or less than 10,000 µm$^2$. However, the size and/or shape of the LEE is not a limitation of the present invention.

As used herein, "phosphor" refers to any material that shifts the wavelengths of light irradiating it and/or that is luminescent, fluorescent, and/or phosphorescent, and is utilized interchangeably with the term "light-conversion material." As used herein, a "phosphor" may refer to only the photoactive powder or particles or to the powder or particles within a polymeric binder. The specific components and/or formulation of the phosphor and/or binder material are conventional and not limitations of the present invention. The binder may also be referred to as an encapsulant or a matrix material.

In an aspect, embodiments of the invention feature a method of forming an illumination system. A lightsheet is provided and mated to an optical substrate. The lightsheet includes or consists essentially of a support substrate, a plurality of electrical traces disposed on the substrate, and a plurality of light-emitting elements electrically coupled to the electrical traces. Thereafter, the support substrate is separated into a plurality of discrete substrate portions each (i) having at least one light-emitting element disposed thereon, (ii) having a surface area substantially smaller than a surface area of the optical substrate, and (iii) remaining bonded to the optical substrate.

Embodiments of the invention may include one or more of the following in any of a variety of combinations. The optical substrate may include a plurality of optical elements, and at least one light-emitting element may be associated with each optical element. The optical substrate may include a plurality of wells each aligned with an optical element, and mating the lightsheet to the optical substrate may include or consist essentially of disposing at least one light-emitting element within each well. Prior to mating the lightsheet to the optical substrate, each well may include a light-conversion material therewithin. After separating the support substrate into the plurality of discrete substrate portions, each discrete substrate may at least partially seal (i.e., cover and/or enclose) one or more wells. The cross-sectional area of the optical substrate may be at least 100 times, or even at least 1000 times, the cross-sectional area of each of the discrete substrate portions. Separating the support substrate into a plurality of discrete substrate portions may include or consist essentially of removing portions of the support substrate between adjoining discrete substrate portions. At least one of the removed portions of the support substrate may include one or more light-emitting elements disposed thereon. The optical substrate may include a plurality of electrical conductors thereon prior to mating of the lightsheet to the optical substrate. Mating the lightsheet to the optical substrate may include or consist essentially of electrically coupling each electrical trace to an electrical conductor. Prior to mating of the lightsheet to the optical substrate, the lightsheet may be partially separated along lines defining the plurality of discrete substrate portions. Prior to mating of the lightsheet to the optical substrate, the lightsheet may include a light-conversion material disposed over each light-emitting element.

In another aspect, embodiments of the invention feature a method of forming an illumination system. A plurality of discrete substrates is provided, and each of the discrete substrates is mated to an optical substrate comprising a plurality of wells defined therein. Each of the discrete substrates includes or consists essentially of (i) a plurality of electrical traces disposed thereon and (ii) one or more light-emitting elements electrically coupled to the electrical traces. After the mating step, (i) each discrete substrate at least partially seals a well and (ii) the one or more light-emitting elements disposed on the discrete substrate are disposed within the well.

Embodiments of the invention may include one or more of the following in any of a variety of combinations. The optical substrate may include or consist essentially of a plurality of optical elements each associated with at least one well. Each optical element may be aligned with at least one well. The cross-sectional area of the optical substrate may be at least 100 times, or even at least 1000 times, the cross-sectional area of each of the discrete substrates. Prior to mating the discrete substrates to the optical substrate, each well may include a light-conversion material therewithin. The optical substrate may include a plurality of electrical conductors thereon prior to the mating of the discrete substrates to the optical substrate. Mating the discrete substrates to the optical substrate may include or consist essentially of electrically coupling each electrical trace to an electrical conductor. Prior to the mating of the discrete substrates to the optical substrate, each discrete substrate may include a light-conversion material disposed over each light-emitting element.

In yet another aspect, embodiments of the invention feature an illumination system including or consisting essentially of an optical substrate and a plurality of discrete substrates mated to the optical substrate. The optical substrate includes a plurality of wells therein and electrical conductors disposed between the wells. Each of the discrete substrates includes (i) a plurality of electrical traces disposed thereon and (ii) one or more light-emitting elements electrically coupled to the electrical traces. Each discrete substrate at least partially seals a well. The one or more light-emitting elements disposed on the discrete substrate are disposed within the at least partially sealed well. Each electrical conductor is electrically connected to an electrical trace.

Embodiments of the invention may include one or more of the following in any of a variety of combinations. A light-conversion material may be disposed in at least one of (e.g., all of) the wells. The cross-sectional area of the optical substrate may be at least 100 times, or even at least 1000 times, the cross-sectional area of each of the discrete substrates. The optical substrate may include a plurality of optical elements each associated with at least one well. Each optical element may be aligned with at least one well.

In a further aspect, embodiments of the invention feature an illumination system including or consisting essentially of a plurality of discrete substrates mated to an optical substrate. The optical substrate includes a plurality of holes therethrough and electrical conductors disposed between the holes. Each discrete substrate includes a plurality of electrical traces disposed thereon and one or more light-emitting elements electrically coupled to the electrical traces. Each discrete substrate at least partially covers a hole. The one or more light-emitting elements disposed on the discrete substrate reside within the hole. Each electrical conductor is electrically connected to an electrical trace. A light-conversion material may be disposed in at least one of (e.g., all of) the holes. The cross-sectional area of the optical substrate may be at least 100 times, or even at least 1000 times, the cross-sectional area of each of the discrete substrates. A light-conversion material may be disposed over at least one light-emitting element (e.g., all of the light-emitting elements).

In yet a further aspect, embodiments of the invention feature a method of forming an illumination system. A monolithic lightsheet is provided and mated to an optical substrate comprising a plurality of wells therein. The monolithic lightsheet defines a plurality of lighting units each comprising (i) a portion of the support substrate, (ii) a plurality of electrical traces disposed thereon, and (iii) one or more light-emitting elements electrically coupled to the electrical traces. Each of a first plurality of lighting units is aligned with a well such that the one or more light-emitting elements of the lighting unit are disposed within the well, and a second plurality of lighting units are each disposed between wells such that the light-emitting elements thereof are not disposed within a well. Each of the second plurality of lighting units is removed from the optical substrate, the first plurality of lighting units remaining mated to the optical substrate. After removing each of the second plurality of lighting units from the optical substrate, the second plurality of lighting units may be mated to the optical substrate such that (i) each of a third plurality of lighting units is aligned with a well such that the one or more light-emitting elements of the lighting unit are disposed within the well, and (ii) a fourth plurality of lighting units are each disposed between wells such that the light-emitting elements thereof are not disposed within a well. Each of the fourth plurality of lighting units may be removed from the optical substrate, the third plurality of lighting units remaining mated to the optical substrate.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. As used herein, the term "substantially" means ±10%, and in some embodiments, ±5%. The term "consists essentially of" means excluding other materials that contribute to function, unless otherwise defined herein. Nonetheless, such other materials may be present, collectively or individually, in trace amounts.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 4 is a schematic of another lighting apparatus in accordance with an embodiment of the present invention;

FIGS. 5A and 5B are a cross-sectional and plan view, respectively, of a portion of the structure of FIG. 4 at an early stage of manufacture;

FIGS. 6A and 6B depict the attachment of a light-emitting element to a substrate in accordance with an embodiment of the present invention;

FIGS. 7 and 8 show portions of the structure of FIG. 4 at an early stage of manufacture;

FIGS. 9A and 9B show examples of pads on conductive traces in accordance with an embodiment of the present invention;

DETAILED DESCRIPTION

Figure 2:
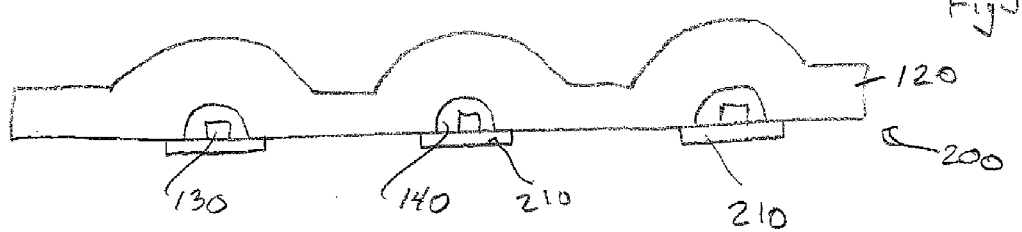
FIG. 2 is a schematic of a lighting apparatus in accordance with an embodiment of the present invention.

FIG. 2 depicts a system 200 that includes one or more LEEs 130, one or more regions 140, and an optical substrate 120. Rather than include a monolithic substrate supporting the LEEs 130, system 200 features multiple substrates 210, each of which supports one or more LEEs 130. In various embodiments, the stress in the system 200 is proportional to the attached or bonded area between the optical substrate 120 and the substrate or substrates on which the LEEs 130 are formed.

By using multiple small substrates 210 instead of one large light-emitter substrate (as in FIG. 1), the stress at each LEE 130 is reduced. As an example, a typical light-emitter substrate 110 may have an area of about 1000 cm$^2$ or more (e.g., about 4000 cm$^2$ or more). In comparison, a substrate 210 may have an area of about 2 cm$^2$ or less (e.g., about 0.25 cm$^2$ or less). The large area reduction, on the order of at least 100×, or even at least 1000×, results in greatly reduced stress in the system. The light-emitter substrates 210 typically include or consist essentially of materials different from that of optical substrate 120. In some embodiments the TCE of different components, for example light-emitter substrate 210 and optical substrate 120 is different by at least about 25%, or by at least about 50%, or by at least about a factor of two or by at least about a factor of five or even greater. For example, light-emitter substrate 210 may include or consist essentially of GaN (TCE of approximately 4×10$^{-6}$/° C.), optical substrate 120 may include or consist essentially of polyethylene terephthalate (TCE of approximately 10×10$^{-6}$/° C.), and the binder may include or consist essentially of silicone (TCE of approximately 70×10$^{-6}$/° C.).

Substrate 210 may include or consist essentially of a semicrystalline or amorphous material, e.g., polyethylene naphthalate (PEN), polyethylene terephthalate (PET), acrylic, polycarbonate, polyethersulfone, polyester, polyimide, polyethylene, and/or paper. Substrate 210 may be substantially flexible, substantially rigid, or substantially yielding. Substrate 210 may include multiple layers of the same or different materials, e.g., a deformable layer over a rigid layer, for example, a semicrystalline or amorphous material, e.g., PEN, PET, polycarbonate, polyethersulfone, polyester, polyimide, polyethylene, paint, ink, plastic film, and/or paper formed over a rigid substrate for example including, acrylic, aluminum, steel and the like.

Figure 3:
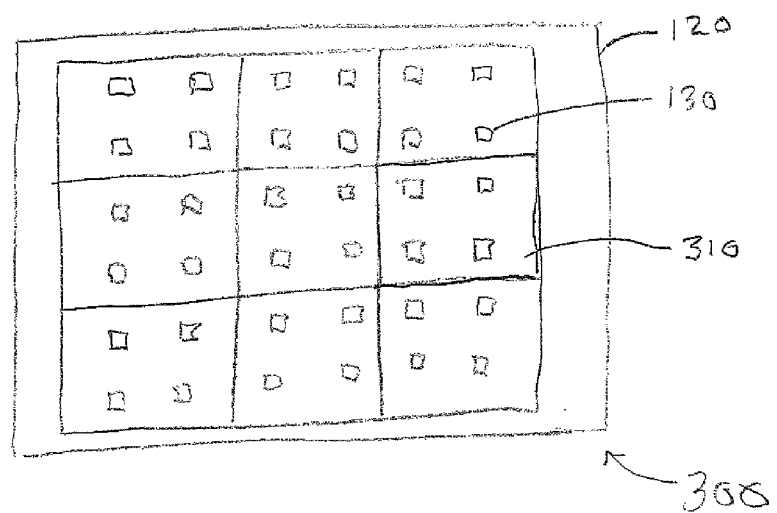
FIG. 3 is a plan-view schematic of a lighting apparatus in accordance with an embodiment of the present invention.

FIG. 2 depicts one LEE 130 attached to each light-emitter substrate 210; however, this is not a limitation of the present invention and in other embodiments multiple LEEs 130 are attached to each light-emitter substrate 210. FIG. 3 shows a plan view of a system 300 in which an underlying substrate has been divided into sections 310, each of which supports four LEEs 130. In some embodiments, sections 310 are formed by cutting a light-emitter substrate 110, shown in FIG. 1, into sections 310 after it has been mated to an optical substrate 120. In other embodiments, sections 310 are formed before mating to optical substrate 120. In some embodiments, sections 310 have more space between them than the kerf from cutting a light-emitter substrate 110 into sections 310.

Figure 1:
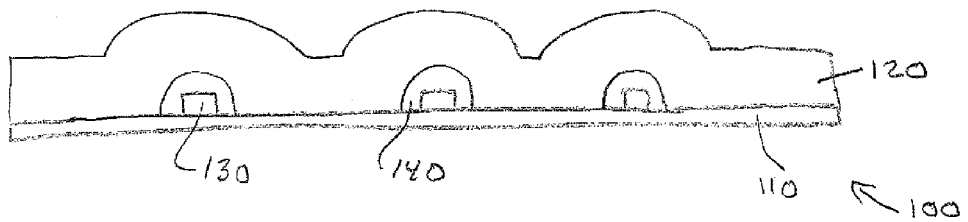
FIG. 1 is a schematic of a light-emitting system.

While FIGS. 1 and 2 show region 140 as a well or depression in optical substrate 120, this is not a limitation of the present invention, and in other embodiments region 140 includes or consists essentially of a structure formed over a portion or all of LEE 130 and/or a portion or all of light-emitter substrate 210. In some embodiments, the mating side of optical substrate 120 (i.e., the side mated to substrates 210) is substantially planar.

FIG. 3 depicts the sections 310 as square-shaped; however, this is not a limitation of the present invention and in other embodiments sections 310 are rectangular, hexagonal, circular, or have any arbitrary shape. FIG. 3 shows sections 310 each supporting four LEEs 130; however, this is not a limitation of the present invention and in other embodiments each section 310 supports fewer or more LEEs 130. In some embodiments, a section 310 includes or consists essentially of a strip of a light-emitter substrate 110, with a line of LEEs, that is a 1×n array of LEEs, where n is an integer greater than one.

In general, the smaller the size of a section 310, the smaller the stress generated in the system, and the less likely will be stress-induced problems. Embodiments of the present invention do not change the intrinsic TCE of the materials in a light-emitting system, but rather reduce the intensity of the stress generated by the mating of two or more materials with different TCEs.

FIGS. 4 through 13 and the accompanying description describe various embodiments of the invention, some of which incorporate elements described in U.S. patent application Ser. No. 13/604,880, filed Sep. 6, 2012, the entire disclosure of which is incorporated by reference herein.

FIG. 4 shows a cross-sectional view of a system 400 that features an optical substrate 120 having optical elements 410 formed in or on one side thereof. One or more conductive traces 420 and wells 440 are formed over or within the side of optical substrate 120 opposite the optical elements 410. The electrical contacts on the LEE 130 (not shown for clarity) are electrically coupled to conductive traces 430 formed over the LEE substrate 210. The conductive traces 430 are electrically coupled to the conductive traces 420. The details of the electrical connection of LEE 130 to conductive traces 430 and electrical connection of conductive traces 430 to conductive traces 430 are omitted from FIG. 4 for clarity. Wells 440 may be unfilled or partially or completely filled with a transparent matrix material and/or a mixture of phosphor and matrix material. In another embodiment, wells 440 are not present in optical substrate 120, and a transparent matrix material or a mixture of phosphor and matrix material is formed over a portion or all of LEEs 130 and/or a portion or all of LEE substrate 210. In some embodiments the mating side of optical substrate 120 (i.e., the side facing substrates 210) is substantially planar.

Optical substrate 120 typically features an array of optical elements 410; in some embodiments, one optical element 410 is associated with each LEE 130, while in other embodiments multiple LEEs 130 are associated with one optical element 410, or multiple optical elements 410 are associated with a single LEE 130. Alternatively, one or more LEEs 130 may not be associated with an engineered optical element but may instead be associated with, e.g., a flat or roughened surface. In one embodiment optical substrate 120 includes elements or features to scatter, diffuse, and/or spread out light generated by LEEs 130. In some embodiments optical substrate 120 may lack optical elements and the side of optical substrate 120 opposite the side with LEEs 130 may be substantially planar.

Optical substrate 120 may be substantially optically transparent or translucent. For example, optical substrate 120 may exhibit a transmittance greater than about 70% for optical wavelengths ranging between approximately 400 nm and approximately 700 nm. Optical substrate 120 may include or consist essentially of a material that is transparent to a wavelength of light emitted by LEE 130 and/or phosphor 450. Optical substrate 120 may be substantially flexible or rigid. Optical substrate 120 may include or consist essentially of, for example, acrylic, polycarbonate, polyethylene naphthalate (PEN), polyethylene terephthalate (PET), polycarbonate, polyethersulfone, polyester, polyimide, polyethylene, polyurethane, glass or the like. In some embodiments, optical substrate 120 includes multiple materials and/or layers. Optical elements 410 may be formed in or on optical substrate 120. For example, optical elements 410 may be formed by etching, polishing, grinding, machining, molding, embossing, extruding, casting, or the like. The method of formation of optical elements 410 is not a limitation of embodiments of the present invention. In some embodiments optical elements 410 and optical substrate 120 feature multiple components.

Optical elements 410 associated with optical substrate 120 may all be the same or may be different from each other. Optical elements 410 may include or consist essentially of, e.g., a refractive optic, a diffractive optic, a total internal reflection (TIR) optic, a Fresnel optic, or the like, or combinations of different types of optical elements. Optical elements 410 may be shaped or engineered to achieve a specific light distribution pattern from the array of light emitters, optical elements, and optional phosphors.

Conductive traces 420 and 430 may include or consist essentially of any conductive material, for example metals such as gold, silver, aluminum, copper and the like, conductive oxides, carbon, etc. Conductive traces 420 may be formed on optical substrate 120 by a variety of methods, for example physical deposition, plating, electroplating, printing, lamination, or the like. In one embodiment, conductive traces 420 are formed using printing, for example screen printing, stencil printing, flexo, gravure, ink jet, or the like. In one embodiment conductive traces 420 are formed by laminating a conductive film to substrate 120 or 210 and patterning the film to form conductive traces 420. Conductive traces 420 may include or consist essentially of a transparent conductor, for example, a transparent conductive oxide such as indium tin oxide (ITO). Conductive traces 420 may include or consist essentially of multiple materials. Conductive traces 420 may optionally feature stud bumps to aid in electrical coupling of conductive trace 420 to conductive trace 430. Conductive traces 420 and 430 may have a thickness in the range of about 0.05 µm to about 100 µm. While the thickness of one or more of the conductive traces 420 and 430 may vary, the thickness is generally substantially uniform along the length of the conductive trace 420 and 430 to simplify processing. However, this is not a limitation of the present invention and in other embodiments the conductive trace thickness or material varies.

In some embodiments of the present invention, wells 440 are filled or partially filled with material 450, which may include or consist essentially of a transparent or optically transmissive material, also called a matrix material or binder. In one embodiment, the transparent matrix or binder includes silicone, epoxy, polyurethane, or other suitable materials. Examples of suitable matrix materials include materials from the ASP series of silicone manufactured by Shin Etsu, or the Sylgard series manufactured by Dow Corning.

In other embodiments of the invention, material 450 includes or consists essentially of a mixture of one or more light-conversion materials and a matrix material. The light-conversion material is incorporated to shift one or more wavelengths of at least a portion of the light emitted by LEE 130 to other desired wavelengths (which are then emitted from the larger device alone or color-mixed with another portion of the original light emitted by the die). A light-conversion material may feature phosphor powders, quantum dots, or the like within a transparent matrix. Phosphors are typically available in the form of powders or particles, and in such case may be mixed in binders, e.g., silicone. Phosphors vary in composition, and may include lutetium aluminum garnet (LuAG or GAL), yttrium aluminum garnet (YAG) or other phosphors known in the art. GAL, LuAG, YAG and other materials may be doped with various materials including for example Ce, Eu, etc. Material 450 may include a plurality of individual phosphors. The specific components and/or formulation of the phosphor and/or matrix material are not limitations of the present invention.

In some embodiments phosphor 450 includes multiple layers of phosphor-infused matrix and/or matrix. That is, the phosphor may include multiple layers, where each layer includes either a phosphor-infused matrix or solely the matrix material. Where multiple layers of phosphor-infused matrix are used, each layer may include different phosphors and/or different matrix materials. In one embodiment, a phosphor layer includes a first layer (i.e., closer to the LEE 130) of a matrix material that is transparent or transmissive to a wavelength of light emitted by LEE 130 and second layer including one or more phosphors within a matrix material.

In some embodiments one or more LEEs 130 each includes or consists essentially of an LED. LEEs 130 may emit in a range of wavelengths and may include materials from the group consisting of Si, Ge, InAs, AlAs, GaAs, InP, AlP, GaP, InSb, GaSb, AlSb, GaN, AN, InN, and/or mixtures and alloys (e.g., ternary or quaternary alloys) thereof. In preferred embodiments, a LEE 130 is an inorganic device, rather than a polymeric or organic device. As referred to herein, a LEE 130 may be packaged or unpackaged unless specifically indicated (e.g., a bare-die LEE is an unpackaged semiconductor die). LEE 130 is typically formed on a substrate and in some embodiments all or a portion of the substrate is removed, for example by chemical etching, dry etching, laser lift off, mechanical grinding and/or chemical-mechanical polishing or the like. Optionally a second substrate—e.g., one that is transparent to or reflective of a wavelength of light emitted by LEE 130—may be attached to LEE 130 prior to or after the attachment of LEE 130 to conductive traces 430.

LEE substrate 210 may include or consist essentially of a semicrystalline or amorphous material, e.g., polyethylene naphthalate (PEN), polyethylene terephthalate (PET), acrylic, polycarbonate, polyethersulfone, polyester, polyimide, polyethylene, polyurethane, and/or paper. LEE substrate 210 may be substantially flexible, substantially rigid or substantially yielding. In some embodiments, the substrate is "flexible" in the sense of being pliant in response to a force and resilient, i.e., tending to elastically resume an original configuration upon removal of the force. A substrate may be "deformable" in the sense of conformally yielding to a force, but the deformation may or may not be permanent; that is, the substrate may not be resilient. Flexible materials used herein may or may not be deformable (i.e., they may elastically respond by, for example, bending without undergoing structural distortion), and deformable substrates may or may not be flexible (i.e., they may undergo permanent structural distortion in response to a force). The term "yielding" is herein used to connote a material that is flexible or deformable or both.

LEE substrate 210 may include multiple layers, e.g., a deformable layer over a rigid layer, for example, a semicrystalline or amorphous material, e.g., PEN, PET, polycarbonate, polyethersulfone, polyester, polyimide, polyethylene, paint, polyurethane, plastic film and/or paper formed over a rigid substrate for example including, acrylic, aluminum, steel and the like. Depending upon the desired application for which embodiments of the invention are utilized, LEE substrate 210 may be substantially optically transparent, translucent, or opaque. For example, LEE substrate 210 may exhibit a transmittance or a reflectivity greater than about 70% for optical wavelengths ranging between approximately 400 nm and approximately 700 nm. In some embodiments LEE substrate 210 exhibits a transmittance or a reflectivity of greater than about 70% for one or more wavelengths emitted by LEE 130 and/or light-conversion material 450. LEE substrate 210 may also be substantially insulating, and may have an electrical resistivity greater than approximately 100 ohm-cm, greater than approximately 1×10⁶ ohm-cm, or even greater than approximately 1×10¹⁰ ohm-cm.

FIGS. 5A and 5B (cross-sectional view and plan view respectively) depict the structure of FIG. 4 at an early stage of manufacture. Shown in FIGS. 5A and 5B are an array of LEEs 130 electrically coupled between conductive traces 430 formed over LEE substrate 110. While FIG. 5B depicts the LEEs 130 serially connected in strings 510, and strings 510 connected or connectable in parallel, other die-interconnection schemes are possible and within the scope of embodiments of the invention.

In one embodiment, one or more LEEs 130 are electrically coupled using conductive adhesive, e.g., an isotropically conductive adhesive and/or an anisotropically conductive adhesive (ACA). An ACA is a material that permits electrical conduction only in one direction, e.g., the vertical direction (out of the plane of the page in FIG. 5B) but insulates in the orthogonal directions, e.g., insulating conductive traces 430 from each other. As shown, the structure includes two serially-connected strings 510 of LEEs 130. As used here, ACA includes an anisotropic conductive material in any form, for example paste, gel, liquid, film or otherwise. ACAs may be utilized with or without stud bumps. Embodiments of the present invention may utilize interconnection schemes based on ACA as described in U.S. patent application Ser. No. 13/171,973, filed Jun. 29, 2011, the entire disclosure of which is incorporated by reference herein.

Various embodiments utilize one or more other electrically conductive adhesives, e.g., isotropically conductive adhesives, in addition to or instead of one or more ACAs. Various embodiments utilize wire bonding or soldering as the method to connect LEEs 130 to conductive traces 430. The methods of attachment and/or electrical coupling of LEEs 130 to conductive traces 430 are not a limitation of the present invention.

FIG. 6A shows a more detailed cross-sectional schematic of the connection of an LEE 130 to conductive traces 430 using an adhesive 610. LEE 130 has contacts 650, at least a portion of each of which is positioned over a conductive trace 430. In FIG. 6A adhesive 610 is an ACA and electrical contact is only substantially made between the portion of contact 650 that is positioned over conductive trace 430. This conductive region is identified as region 660.

FIG. 6B shows a plan-view schematic of the connection of LEEs 130 to conductive traces 430 using adhesive 610. In one embodiment, one or more of the LEEs 130 includes at least two contacts that are connected to adjacent portions of conductive traces 430. In one embodiment, adhesive 610 includes or consists essentially of an ACA. One or more LEEs 130 may be an LED having contacts that provide electrical contact to the p- and n-side of the LED respectively.

As shown in FIG. 6B, two or more LEEs 130 may be connected in parallel to the same conductive traces 430 (i.e., within the same gap 630 between conductive traces 430), thus providing enhanced functionality and/or redundancy in the event of failure of a single LEE 130. In a preferred embodiment, each of the LEEs 130 adhered across the same gap 630 is configured not only to operate in parallel with the others (e.g., at substantially the same drive current), but also to operate without overheating or damage at a drive current corresponding to the cumulative drive current operating all of the LEEs 130 disposed within a single gap. Thus, in the event of an open failure of one or more LEEs 130 adhered across the gap 630, the remaining one or more LEEs 130 will continue to operate at a higher drive current. Of course, as shown in FIGS. 5A and 5B only one LEE 130 may be formed between conductive traces 430.

FIG. 6B also illustrates two possible adhesion schemes. One of the LEEs 130 is adhered to the conductive traces 430 via adhesive 610 only at the ends of the LEE 130, while between the ends within the gap 630, a second adhesive 620 (which is preferably non-electrically conductive) adheres the middle portion of the LEE 130 to LEE substrate 110. In some embodiments, the second adhesive 620 is non-conductive and prevents shorting between the two portions of conductive adhesive 610 and/or between conductive trace 430 and/or between the two contacts of LEE 130. As shown, the other LEE 130 is adhered between the conductive trace 430 with adhesive 610 contacting all or a portion of the bottom surface of LEE 130. As described above, adhesive 610 is preferably an ACA that permits electrical conduction only in the vertical direction (out of the plane of the page in FIG. 6B) but insulates the conductive traces 430 from each other. In other embodiments, one or more LEEs 130 are adhered between conductive trace 430 within the same gap 630, but there is sufficient "real estate" within the gap 630 (including portions of the conductive trace 430) to adhere at least one additional LEE 130 within the gap 630. In such embodiments, if the one or more LEEs 130 initially adhered within the gap 630 fail, then one or more LEEs 130 (substantially identical to or different from any of the initial LEE 130) may be adhered within the gap 630 in a "rework" process. For example, referring to FIG. 6B, only one of the depicted LEEs 130 may be initially adhered to the conductive trace 430, and the other LEE 130 may be adhered later, e.g., after failure of the initial die. For example, a first LEE 130 may fail during manufacture and may be removed and replaced by a second operational LEE 130. Removal of the first LEE 130 may be done, for example, by removing first LEE 130 from conductive trace 430, e.g., by scraping or pulling first LEE 130 off of conductive trace 430. If the first LEE 130 fails as an open-circuit, it may not be necessary to remove first LEE 130 from conductive trace 430.

FIG. 7 shows a portion of system 400 of FIG. 4 at an early stage of manufacture, featuring optical substrate 120 with optical elements 410 on one side and wells 440 and conductive traces 420 on the opposite side. Wells 440 may optionally be filled or partially filled with a matrix material or a phosphor and matrix material. Conductive traces 420 may be similar to conductive traces 430 and may be formed in similar ways as described for conductive traces 430. In some embodiments the layout of conductive traces 420 matches that or is similar to that of conductive traces 430. In an embodiment, wells 440 are not present in optical substrate 120, and a transparent matrix material or a mixture of phosphor and matrix material is formed over a portion or all of LEEs 130 and/or a portion or all of LEE substrate 110 and/or a portion or all of conductive traces 430. In some embodiments, the mating side of optical substrate 120 is substantially planar.

In one embodiment, wells 440 and optical elements 410 are formed simultaneously in the manufacturing process of optical substrate 120, e.g., using a molding or embossing process. In some embodiments, wells 440 are formed by removal of the material of optical substrate 120, for example by drilling, abrasive blasting, etching, laser ablation or the like. Wells 440 may be formed before or after formation of optical elements 410. In some embodiments, wells 440 are aligned relative to optical elements 410. It should be noted that alignment of wells 440 relative to optical elements 410 may mean that the center of well 440 is aligned to the center of optical element 410; however, this is not a limitation of the present invention and in other embodiments alignment refers to a specified relationship between the geometry of wells 440 and the geometry of optical elements 410. A resulting advantage of this approach is the elimination of the need for alignment between light-conversion material 450 and optical element 410 in subsequent manufacturing steps.

In the next step of manufacture, the structure shown in FIGS. 5A and B and the structure shown in FIG. 7 are mated, as shown in FIG. 8, where the LEEs 130 are substantially aligned with and fully or partially immersed in light-conversion material 450 in wells 410 in any of a number of different ways. In one embodiment, well 410 is under-filled with light-conversion material 450, such that after mating substantially all of well 410 is filled with the combination of LEE 130 and light-conversion material 450. In one embodiment, well 410 is under-filled, filled, or overfilled with light-conversion material 450, such that after mating substantially all of well 410 is filled with the combination of LEE 130 and light-conversion material 450, and an excess portion of light-conversion material 450 is forced from well 410 to occupy a portion of the space between LEE substrate 110 and optical substrate 120. The excess portion of light-conversion material 450 may act to hold LEE substrate 110 and optical substrate 120 together. In one embodiment, well 410 has one or more void spaces that are not filled with either LEEs 130 or light-conversion material 450. After mating of LEE substrate 110 and optical substrate 120, the matrix or matrix and phosphor material 450 structure is optionally cured, for example by heating. In some embodiments, this is enough to hold optical substrate 120 and LEE substrate 110 together. In some embodiments, material 450 is partially cured prior to mating of optical substrate 120 and LEE substrate 110.

In order to facilitate electrical conduction and alignment between conductive traces 430 on LEE substrate 110 and conductive traces 420 on optical substrate 120, the geometry of conductive traces 430 and/or traces 420 may be modified. In one embodiment, pads are formed having at least one dimension larger than that of the conductive traces. FIG. 9A shows an example of pads 910 formed at the ends of conductive traces 420 on optical substrate 120. FIG. 9B shows an example of pads 920 formed at the ends of conductive traces 430 on substrate 210.

In some embodiments, electrical conductivity between conductive traces 430 on LEE substrate 110 and conductive traces 420 on optical substrate 120 is enhanced by the use of a conductive material between the two traces. Examples of conductive materials include conductive epoxy, conductive adhesive, ACA, conductive tape, anisotropic conductive tape or film and the like. Such conductive materials may be applied to portions of conductive traces 430 and/or portions of conductive traces 420. Such material may be applied by, for example, printing, ink jet printing, screen printing, dispensing, deposition, such as evaporation or sputtering, through a mask, lamination and optional patterning or the like. This may also aid in the attachment of LEE substrate 110 to optical substrate 120.

In some embodiments, additional techniques may be used to attach LEE substrate 110 to optical substrate 120, for example using an adhesive, a UV- or heat-cured adhesive, physical fasteners or the like. For example, an adhesive may be formed by spraying, spinning, spreading, or may be in tape form, or may be deposited using a doctor blade technique, or by printing. The adhesive may cover substantially all of the mating surfaces or only one or more portions of the mating surfaces. In one preferred embodiment, a material used to mate LEE substrate 110 and optical substrate 120 is transparent to a wavelength of light emitted by LEE 130 and/or light-conversion material 450. More than one material may be used to mate LEE substrate 110 and optical substrate 120.

The size of a LEE 130 may be smaller than well 440 and a modest amount of misalignment of the center of LEE 130 with the center of well 440 may be acceptable. To aid in alignment, alignment features, for example alignment marks or pins or holes or other features on optical substrate 120 that mate or align to corresponding features on LEE substrate 110 may be used. Such alignment features may be formed on optical substrate 120 at the same time or a different time from the formation of wells 440 and/or optical elements 410. Similarly, such alignment features on LEE substrate 110 may be formed at the same time or a different time as conductive traces 430.

In some embodiments, a reflective surface is formed on the back or front of LEE substrate 110, so that any light emitted out the back side (i.e., the side adjacent to LEE substrate 110) of the LEEs 130 is reflected back toward light-conversion material 450. Such a reflective coating may include a metal such as gold, silver, aluminum, copper or the like and may be deposited by evaporation, lamination, sputtering, chemical vapor deposition, plating, electroplating or the like, or may include a reflective coating such as paint, ink or the like, for example white ink or white paint. If the reflective coating is on the same side as conductive traces 430, the reflective coating may be electrically isolated from conductive traces 430 or may be removed in the regions occupied by conductive traces 430. The reflective coating may even be non-conductive. The reflective coating may be formed either over or under conductive traces 430. The reflective coating may cover all or portions of LEE 130 and/or conductive traces 430. The reflective coating may also include other materials, e.g., a Bragg reflector, or one or more layers of a specular or diffuse reflective material. In one embodiment, LEE substrate 110 is backed with a reflective material, for example any one as discussed above, or, e.g., White97 manufactured by WhiteOptics LLC or MCPET manufactured by Furukawa, or any other reflective material. In one embodiment, LEE substrate 110 includes a material that is reflective to a wavelength of light emitted by LEE 130, for example white PET, white paper, MCPET, White97 or the like. In one embodiment, conductive traces 430 include a material reflective to a wavelength of light emitted by LEE 130 and/or light-conversion material 450 and are patterned to provide a region of reflective material surrounding LEE 130.

In one embodiment, one or more materials are formed over all or portions of LEEs 130 prior to mating with optical substrate 120. LEEs 130 may be all or partially coated with a transparent material having a refractive index of at least 1.3, preferably at least 1.4, to decrease total internal reflection losses in LEEs 130. Such an embodiment provides spatial separation between light-conversion material 450 and LEEs 130, which may result in reduced heating of light-conversion material 450. Reduced heating of light-conversion material 450 may be desirable because such reduced heating may result in reducing the efficiency loss and wavelength shift associated with higher light-conversion material temperatures. In some embodiments LEE 130 may be covered by a phosphor or a phosphor and a binder prior to mating with optical substrate 120, as described in U.S. Provisional Patent Application No. 61/589,908, filed Jan. 24, 2012, the entire disclosure of which is incorporated herein by reference.

In accordance with various embodiments of the invention, the LEE substrate 110 is then separated into individual substrates 210, resulting in the structure as shown in FIG. 4. Separation of LEE substrate 110 into substrates 210 may be done in various ways. In one embodiment, LEE substrate is separated into sections 310, as shown in FIG. 3. In one embodiment LEE substrate 110 has portions removed between LEE 130, leaving gaps between substrates 210, as shown in FIG. 4. LEE substrate 110 may be separated or have portions removed using a number of techniques. For example, LEE substrate 110 may be cut using a straight or rotating blade, by die cutting, punching or with a laser. LEE substrate 110 may be partially separated before mating to optical substrate 120, for example with perforations to facilitate separation after mating to optical substrate 120. In one embodiment the perforations are sufficient to permit removal of unwanted sections of LEE substrate by pulling or peeling them off of optical substrate 120.

In some embodiments, LEE substrate 110 is separated into substrates 210 before mating to optical substrate 120 and substrates 210 are placed into position individually. One advantage of this approach is that the individual LEEs 130 may be tested and mapped on the original LEE substrate 110, and then binned after singulation (i.e., formation of substrates 210) from LEE substrate 110. Testing and binning of substrates 210, with one or more LEEs 130 on each substrate 210, permits elimination of failed or out-of-specification LEEs 130. For example LEE substrate 110 may support a plurality of operational LEEs 130 and one or more non-operational or out of specification LEEs 130. After testing all LEEs 130 on LEE substrate 110 and singulation into substrates 210, the non-operational or out of specification LEEs 130 may be removed and not attached to optical substrate 120.

Another advantage of this approach is that LEEs 130 may be formed closer together on LEE substrate 110 before singulation than they would be placed on optical substrate 120, permitting manufacture of a relatively larger number of completed LEE substrate units (LEE substrate 210 and LEE 130) per unit area.

Such techniques also permit sorting of LEEs 130 to achieve more uniform light characteristics than might be achieved without binning. For example, LEE substrate 110 may feature multiple LEEs 130 in two or more groups, each group including or consisting essentially of one or more LEEs 130 having one or more similar characteristics. For example, all of LEEs 130 may be divided into groups based on emission wavelength. Several wavelength-range groups or bins spanning, for example, about 5 nm or about 2.5 nm may be identified, and all of the LEEs 130 may be assigned to wavelength bins according to their emission wavelength. After singulation into substrates 210, the different substrates 210 may be sorted into their respective bins and used for different applications that require different wavelength distributions. Other characteristics may be identified for assigning to groups, e.g., forward voltage, light output power, and the like.

Figure 10:
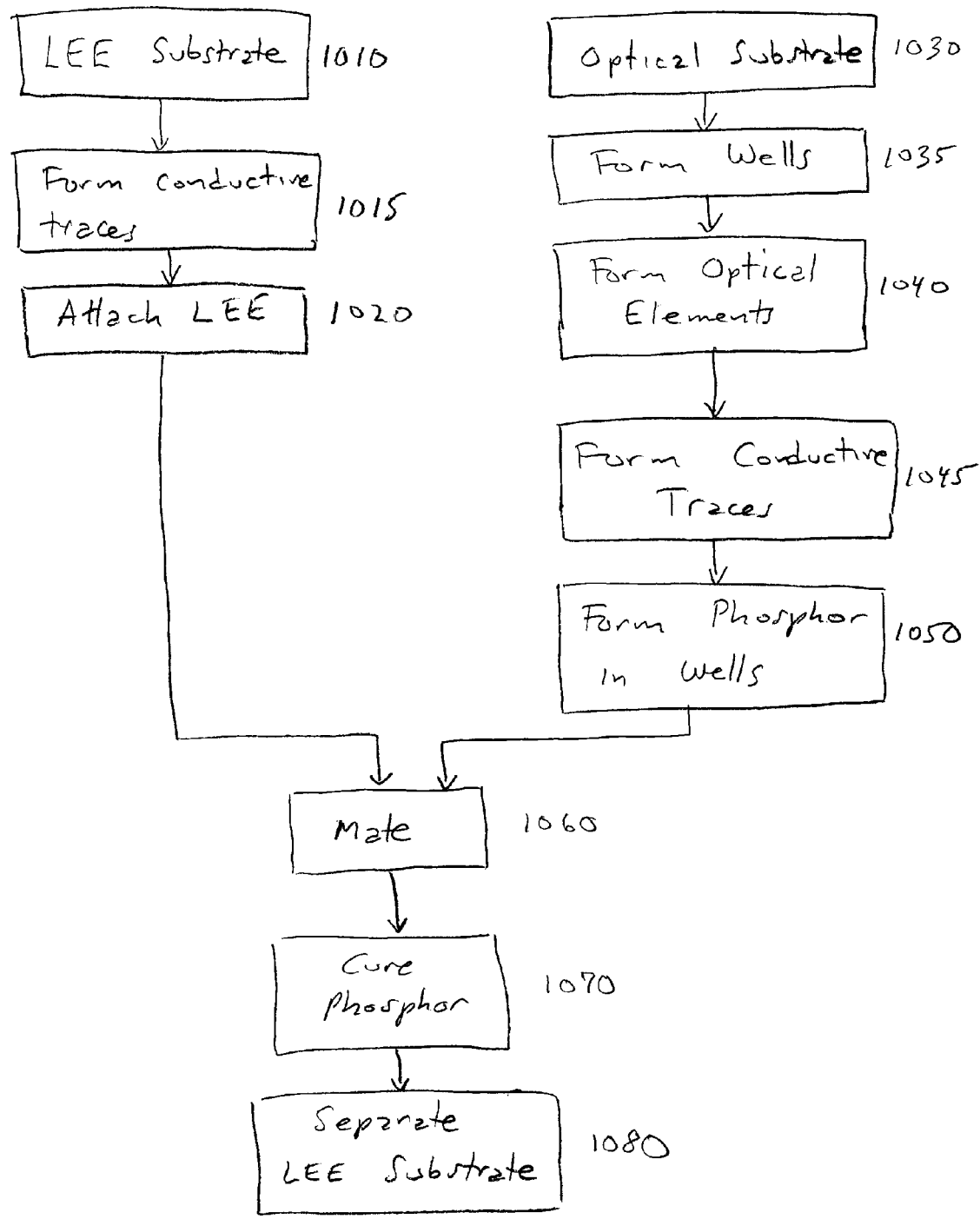
FIG. 10 is a flow chart of an embodiment of the present invention.

FIG. 10 is a general flow chart of the process used to make one embodiment of the structure discussed above with reference to FIG. 4. The process starts with providing the LEE substrate in step 1010. Conductive traces 430 are formed over the LEE substrate 110 in step 1015. LEEs 130 are formed over (and electrically coupled to) conductive traces 430 in step 1020. Step 1020 may include the use of wire bonding or one or more adhesives, e.g., a conductive adhesive, a non-conductive adhesive or an ACA, soldering, eutectic bonding or other means of electrically coupling LEE 130 to conductive traces 430. In parallel a second process starts with the provision of optical substrate 120, as shown in step 1030. Wells 440 are formed in optical substrate 120 in step 1035. Optical elements 410 are formed in optical substrate 120 in step 1040. In some embodiments, steps 1035 and 1040 are performed simultaneously. Conductive traces 420 are formed over optical substrate 120 in step 1045, and phosphor 450 is formed in wells 440 in step 1050. The two processes come together in step 1060, in which the structures are mated together, for example as shown in FIG. 8. Step 1060 may include the use of one or more adhesives, for example a conductive tape, a conductive adhesive or epoxy, a non-conductive adhesive or an ACA, or other means of electrically coupling conductive trances 430 to conductive traces 420. The phosphor 450 is cured in step 1070 and LEE substrate 110 is separated into sections 210 in step 1080. In some embodiments, the process includes additional steps and/or some steps shown in FIG. 10 are omitted and/or the order of the steps is different from that shown in FIG. 10.

Figure 11:
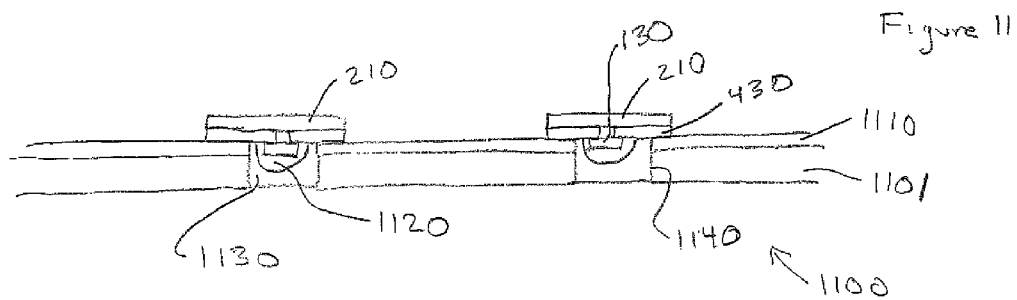
FIG. 11 is a schematic of another lighting apparatus in accordance with an embodiment of the present invention.

FIG. 11 depicts another embodiment of the present invention, system 1100, which includes substrate 1101 over which conductive traces 1110 have been formed and into which through-holes 1140 have been formed. LEEs 130 are electrically coupled to conductive traces 430 formed over LEE substrate 210, which are then electrically coupled to conductive traces 1110 on substrate 1101.

Substrate 1101 and substrate 210 may include or consist essentially of a semicrystalline or amorphous material, e.g., polyethylene naphthalate (PEN), polyethylene terephthalate (PET), acrylic, polycarbonate, polyethersulfone, polyester, polyimide, polyethylene, and/or paper. Substrate 1101 and substrate 210 may be substantially flexible, substantially rigid, or substantially yielding. Substrate 1101 and substrate 210 may include multiple layers of the same or different materials, e.g., a deformable layer over a rigid layer, for example, a semicrystalline or amorphous material, e.g., PEN, PET, polycarbonate, polyethersulfone, polyester, polyimide, polyethylene, paint, plastic film, and/or paper formed over a rigid substrate for example including, acrylic, aluminum, steel and the like. Depending upon the desired application for which embodiments of the invention are utilized, substrate 1101 and substrate 210 may be substantially optically transparent, translucent, or opaque. For example, substrate 1101 and substrate 210 may exhibit a transmittance or a reflectivity greater than about 70% for optical wavelengths ranging between approximately 400 nm and approximately 700 nm. In some embodiments substrate 1110 and substrate 210 may exhibit a transmittance or a reflectivity of greater than about 70% for one or more wavelengths emitted by LEEs 130 and/or the light-conversion material (identified as 450 in previous drawings or 1130 in FIG. 11). Substrate 1101 and substrate 210 may also be substantially insulating, and may have an electrical resistivity greater than approximately 100 ohm-cm, greater than approximately $1 \times 10^6$ ohm-cm, or even greater than approximately $1 \times 10^{10}$ ohm-cm. As discussed above, in one embodiment a reflective surface is formed on the back or front of substrate 210, so that any light emitted out the back side (i.e., the side of substrate 210 opposite LEE 130) of LEE 130 is reflected back toward light-conversion material 1130.

In one embodiment, substrate 1101 includes one or more optical elements (e.g., as shown in FIG. 7). In some embodiments, one optical element is associated with each LEE 130, while in other embodiments multiple LEEs 130 are associated with one optical element, or multiple optical elements are associated with a single LEE 130. One or more LEEs 130 may not be associated with an engineered optical element, but may instead be associated with a flat or roughened surface. In one embodiment, substrate 1101 includes elements or features to scatter, diffuse and/or spread out light generated by LEEs 130.

System 1100 of FIG. 11 may be manufactured in a substantially similar fashion as that described with respect to system 400. However, system 1100 includes two materials formed over LEEs 130, rather than merely a material 450 as in FIG. 4. Material 1120 may partially or fully cover a LEE 130 and may be transparent and have a refractive index of at least 1.3, preferably at least 1.4, to decrease total internal reflection losses in the LEE 130. Such an embodiment provides spatial separation between and LEE 130 and light-conversion material (phosphor) 1130, which may result in reduced heating of light-conversion material 1130. Reduced heating of light-conversion material 1130 may be desirable because it may result in reducing the efficiency loss and wavelength shift associated with higher light-conversion material temperatures.

In some embodiments, material 1120 is applied to cover or partially cover LEEs 130 prior to mating with substrate 1100. In such embodiments, the LEE 130 with material 1120 formed thereover or partially thereover is immersed or partially immersed into well 1140 of substrate 1100 that is partially or completely filled with material 1130. This approach may be used in other embodiments of the invention as well. In other embodiments, wells 1140 do not contain materials 1120, 1130 prior to mating.

In the previously described embodiments LEEs 130 have been formed on LEE substrate 110 with a pattern substantially matching the features of that on the mating piece, for example wells 1140 of substrate 1101 (FIG. 11) or wells 440 of optical substrate 120 (FIG. 7). In another embodiment, LEEs 130 are formed on LEE substrate 110 with a density higher than that of the matching features on the mating piece. In some embodiments the spacing or pitch between LEEs 130 on LEE substrate 110 may be in the range of about 2 mm to about 50 mm. In some embodiments LEEs 130 have a dimension in the range of about 25 μm to about 500 μm. Thus, the density of LEEs 130 on LEE substrate 110 may be in the range of about 5× larger to about 100× larger than the density of matching features on the mating piece. In one embodiment, the LEEs 130 on LEE substrate 110 have a spacing that is an integer divisor of the spacing of the mating features. For example, if the mating features are spaced about 10 mm apart, the LEE 130 may be spaced about 1 mm apart, or may be spaced about 0.5 mm apart. Thus, when LEE substrate 110 is mated with the matching substrate, some of LEEs 130 match up with the matching features and one or more LEEs 130 are positioned on LEE substrate 110 in between adjacent matching features.

Figure 12:
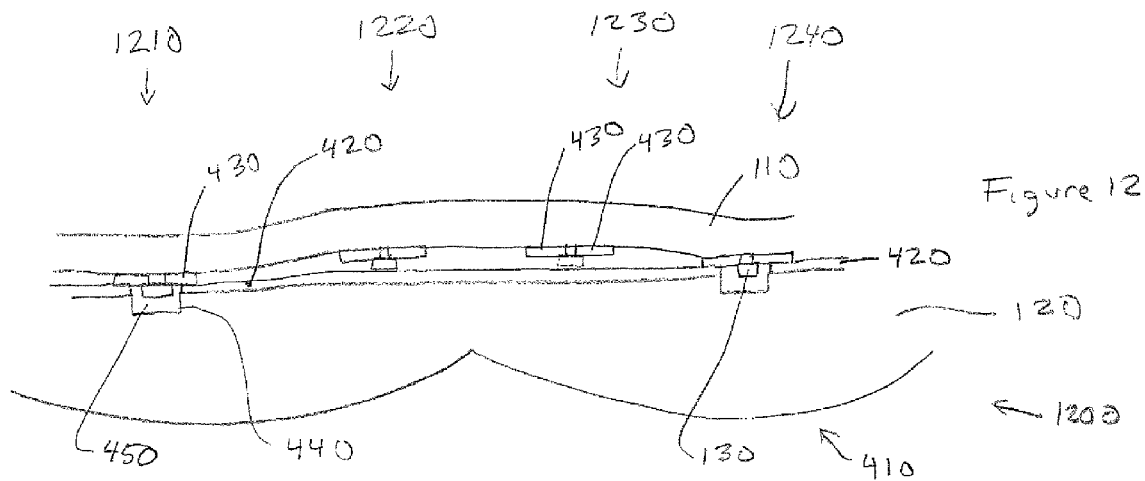
FIGS. 12 and 13 depict lighting apparatuses at an intermediate stage of manufacture in accordance with various embodiments of the present invention.
Figure 13:
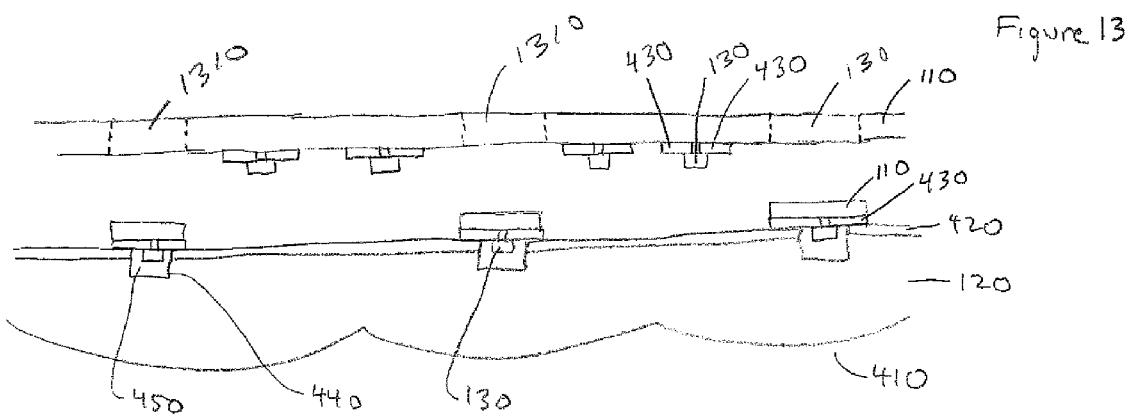

FIG. 12 shows one embodiment of the invention, similar to that shown and discussed in reference to FIG. 4. A difference between system 1200 shown in FIG. 12 and the structure shown in FIG. 8 (the structure shown in FIG. 4 at an early stage of manufacture) is that LEE substrate 110 has one or more LEEs 130 (identified as 1220 and 1230) between LEEs 130 that are aligned with wells 440 (identified as 1210 and 1240). During the manufacture, LEE substrate 110 is first aligned as shown in FIG. 12 and LEE units 1210 and 1240 are mated with optical substrate 120 (conductive traces 430 mated with conductive traces 420). Then, the portions of LEE substrate 110 associated with LEEs 1210 and 1240 are separated from the main LEE substrate 110 as shown in FIG. 13, and the main LEE substrate 110 is removed and repositioned on optical substrate 120 or another optical substrate 120 and the remaining LEEs are matched up with features on optical substrate 120 and mated to optical substrate 120 and again the portions of LEE substrate 110 associated with those LEEs is separated from the main LEE substrate 110, and the process may be repeated until all or substantially all of the LEEs are placed. After the first set of LEEs are placed and separated, LEE substrate 110 appears as shown in FIG. 13, having holes 1310 where LEEs have been separated therefrom.

Figure 14:
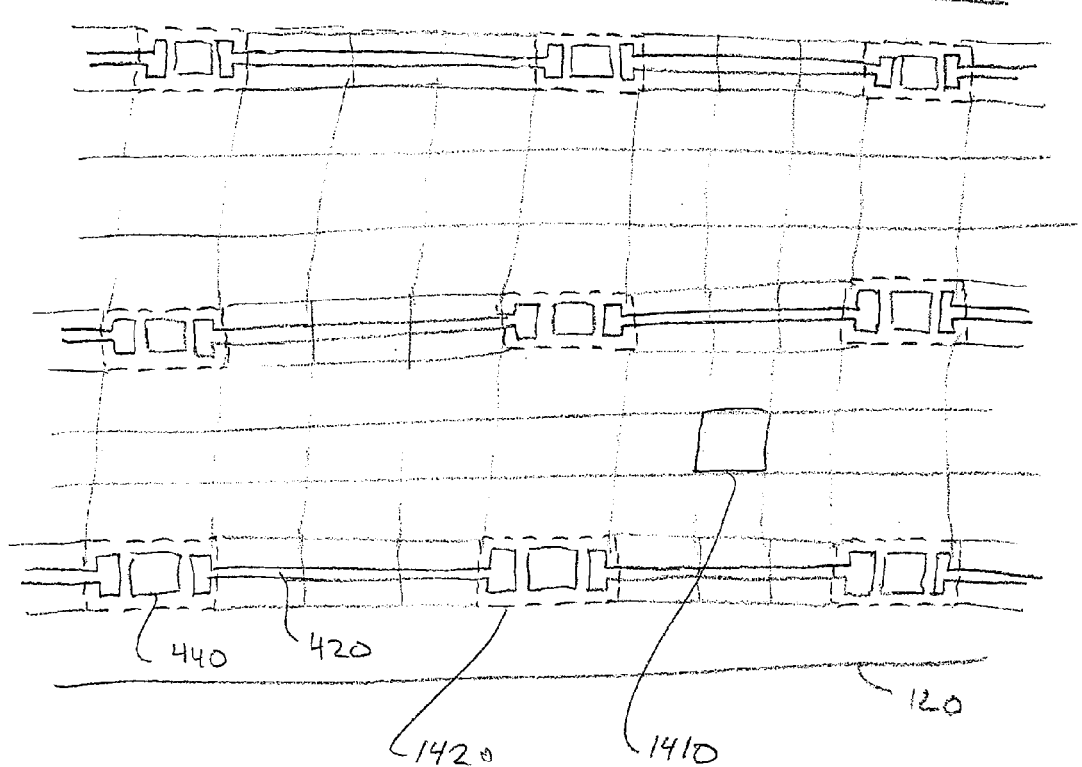
FIGS. 14-16 are schematics of lighting apparatuses in accordance with various embodiments of the present invention.

FIG. 14 is a plan view of one embodiment of the present invention that features a 3×3 array of wells 440 on optical substrate 120. Overlaid on the array is LEE substrate 110 (not identified in FIG. 14) that is delineated into cells 1410. Each cell 1410 includes one LEE 130 (not shown). Wells 440 have a larger (but preferably with an integer multiplier) pitch than LEEs 130, resulting in the formation of more LEEs 130 on LEE substrate 110 than wells 440 for the same area. In the example shown in FIG. 14, the LEE 130 array (or LEE cell 1410 array) is 9×9 units, while the well 440 array is 3×3. In one cycle of the operation, nine LEE units 130 are mated with wells 440, identified by the dashed lines. However, in the same area there are an additional 72 (original 81 less the 9 placed) LEE cells 1410 that may be placed in subsequent cycles of the process. One advantage of this approach is that LEEs 130 in LEE cells 1410 may be placed on LEE substrate 110 much closer together than if they had the pitch of the matching units. This increases throughput in the placing tools used to place LEEs 130 on LEE substrate 110, reduces the amount of LEE substrate required, and in general reduces the overall cost of the system.

An additional advantage is that LEEs 130 may be tested and mapped before or after placement on LEE substrate 130, and this information used to adjust placement and/or separation of the LEE units from LEE substrate 110 in order to increase yield, or to achieve more uniform optical or electrical characteristics within a string or across all or a portion of the array of LEE 130. For example, referring to FIG. 14, if LEE unit 1420 is out of specification or non-functional, it may be left attached to the main portion of LEE substrate 110 while the other 8 LEE units associated with that pitch and placement are separated from the main portion of LEE substrate 110 and mated to optical substrate 120. This leaves an empty well 440 associated with an LEE unit 1420. In one embodiment, this is left empty and conductive traces 420 adjacent to LEE unit 1420 may be shorted. In another embodiment the empty well is populated, for example with LEE 130 or another active or passive device, at a later stage of manufacture. While this approach is described with reference to a system having an optical substrate such as optical substrate 120, this is not a limitation of the present invention and in other embodiments other structures may be employed.

Figure 15:
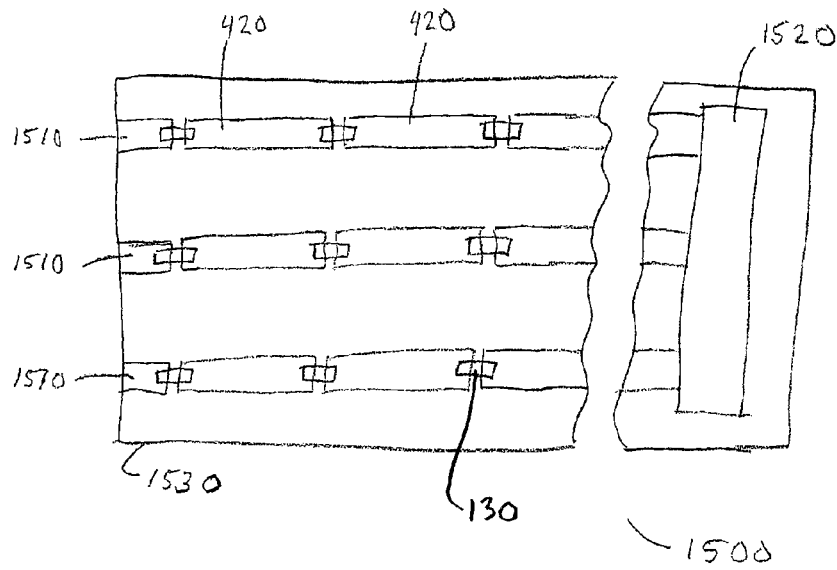

The systems described above may be combined with additional electronics to form an electronic device 1500 as shown in FIG. 15. In one embodiment, the device includes multiple LEEs 130 that are electrically coupled to traces 420. As shown, electronic device 1500 includes three serially-connected strings 1510 of LEEs 130. Electronic device 1500 also includes circuitry 1520 electrically connected to one or more of strings 1510. Circuitry 1520 may include or consist essentially of portions or substantially all of the drive circuitry, sensors, control circuitry, dimming circuitry, and or power-supply circuitry or the like, and may also be adhered (e.g., via an adhesive) or otherwise attached to a substrate 1530. In one embodiment, the power supply and driver are distributed, e.g., the device 1500 may have a centralized power supply and all or a portion of the drive circuitry distributed in different locations. Circuitry 1520 may even be disposed on a circuit board (e.g., a printed circuit board) that itself may be mechanically and/or electrically attached to substrate 1530. In other embodiments, circuitry 1520 is separate from substrate 1530. In some embodiments circuitry 1520 is formed on substrate 1530. While FIG. 15 depicts the LEEs 130 serially connected in strings 1510, and strings 1510 connected or connectable in parallel, other die-interconnection schemes are possible and within the scope of embodiments of the invention.

As shown in FIG. 15, the lighting system 1500 may feature multiple strings, each string including or consisting essentially of a combination of one or more LEEs 130 electrically connected in series, in parallel, or in a series-parallel combination with optional fuses, antifuses, current-limiting resistors, zener diodes, transistors, and other electronic components to protect the LEEs 130 from electrical fault conditions and limit or control the current flow through individual LEEs 130 or electrically-connected combinations thereof. In general, such combinations feature an electrical string that has at least two electrical connections for the application of DC or AC power. A string may also include a combination of one or more LEEs 130 electrically connected in series, in parallel, or in a series-parallel combination of LEEs 130 without additional electronic components. FIG. 15 shows three strings of LEEs 130, each string having three LEEs 130 in series.

Figure 16:
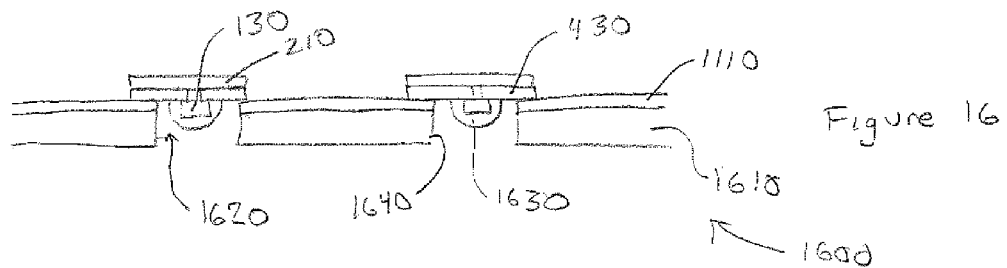

FIG. 16 shows another embodiment of the present invention, system 1600, that includes a base substrate 1610 having holes 1620 formed therein, as well as conductive traces 1110 formed thereover. One or more LEEs 130 are electrically coupled to conductive traces 420 on LEE substrate 210 and conductive traces 430 over LEE substrate 210 are electrically coupled to conductive traces 1110 formed over base substrate 1610. Base substrate 1610 may include or consist essentially of any of the materials described above with respect to substrate 1101 or other substrate materials. In one embodiment, material 1630 is formed over all or a portion of one or more LEEs 130. Holes 1620 have sidewalls 1640. In some embodiments the sidewalls 1640 are perpendicular to the surface of base substrate 1610; however, this is not a limitation of the present invention and in other embodiments sidewalls 1640 are sloped, curved or have other shapes. In some embodiments sidewalls 1640 are reflective to a wavelength of light emitted by LEE 130 and/or phosphor material 1630. In some embodiments sidewalls 1640 are coated with a material that is reflective to a wavelength of light emitted by LEE 130 and/or phosphor material 1630, for example silver, gold, aluminum, or a white reflective material, for example White97 manufactured by WhiteOptics LLC or MCPET manufactured by Furukawa, or any other reflective material. In some embodiments the substrate 1610 may include or consist essentially of a reflective material, and thus sidewalls 1640 may be reflective as a result.

Figure 17:
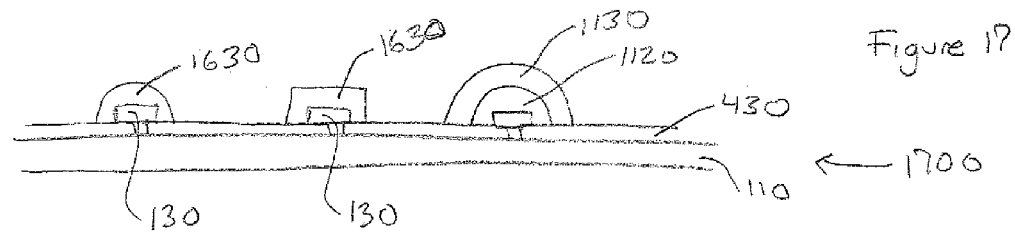
FIGS. 17 and 18 depict portions of the structure of FIG. 16 at early stages of manufacture.

In one embodiment, the manufacture of system 1600 starts with the structure shown in FIGS. 5A and 5B. FIG. 17 shows the structure of FIG. 16 at a early stage of manufacture. FIG. 17 shows three different embodiments. The left LEE 130 has material 1630 formed over it and has a substantially hemispherical shape. The center LEE 130 has material 1630 formed over it and has a shape that is substantially conformal to LEE 130. The right LEE 130 features materials 1120 and 1130, formed successively over LEE 130, as described above.

Material 1630 may include or consist essentially of a mixture of one or more light-conversion materials and a matrix material. The light-conversion material is incorporated to shift one or more wavelengths of at least a portion of the light emitted by LEE 130 to other desired wavelengths (which are then emitted from the larger device alone or color-mixed with another portion of the original light emitted by the die). In some embodiments material 1630 includes or consists essentially of multiple layers of phosphor-infused matrix and/or matrix. That is, the phosphor may include multiple layers, where each layer includes either a phosphor-infused matrix or solely the matrix material. Where multiple layers of phosphor-infused matrix are used, each layer may include different phosphors and/or different matrix materials. In one embodiment shown for the right LEE 130 in FIG. 17, material 1120 includes or consists essentially of a matrix material that is transparent to a wavelength of light emitted by LEE 130 and material 1130 includes or consists essentially of one or more phosphors within a matrix material.

Figure 18:
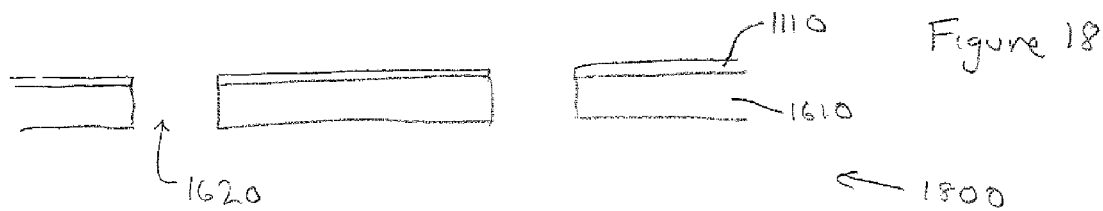

FIG. 18 depicts a structure 1800 that includes a base substrate 1610 featuring conductive traces 1110 formed thereover and holes 1620 formed therethrough. Holes 1620 may have any shape, for example square, rectangular, round, elliptical or any other shape. In an embodiment, holes 1620 are replaced by wells (not shown in the Figures), which may have any size or shape. In one embodiment, the wells may be shaped to match the shape of material 1630, that is, material 1630 fits into a well when system 1700 and system 1800 are mated. In some embodiments, base substrate 1610 features optical elements associated with one or more LEEs 130. In some embodiments, the space between material 1630 and the walls of the wells are filled with air or other gases or fluids. In one embodiment, the space between material 1630 and the walls of a well is filled with a transparent material, and in one embodiment such transparent material has an index of refraction greater than about 1.4.

In the next stage of manufacture structure 1700 (FIG. 17) is mated with structure 1800 (FIG. 18) to form the structure shown in FIG. 16. The arrays of holes 1620 are arranged such that at least some holes 1620 match the position of LEEs 130 on base substrate 1610. In one embodiment, one LEE 130 is associated with one hole 1620. In one embodiment, multiple LEEs 130 are associated with one hole 1620. Structure 1700 may be attached to structure 1800 using a variety of techniques, for example via use of a spray adhesive, a liquid adhesive, a tape or film adhesive, or other means. As discussed above, LEE substrate 110 may be separated into substrates 210 before or after mating with base 1610.

Figure 19:
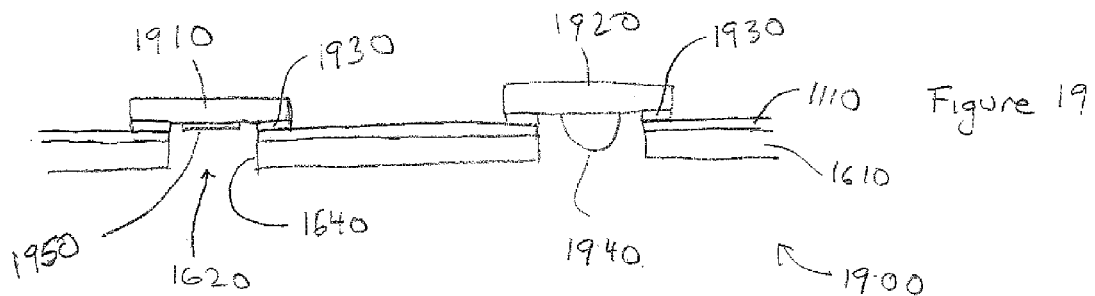
FIG. 19 is a schematic of another lighting apparatus in accordance with an embodiment of the present invention.

FIG. 19 shows another embodiment of the present invention, system 1900, which is similar to system 1600 shown in FIG. 16. However, in system 1900 the LEEs 130 on LEE substrate 210 are replaced by packaged LEDs, i.e., LED dies each in a package, identified as LEDs 1910 and 1920 in FIG. 19. Packaged LED 1910 includes contacts 1930 and emission area 1950, from which the light emanates. Packaged LED 1920 is similar to packaged LED 1910, with the exception that emission area 1950 is replaced by a domed emission area 1940. Packaged LEDs 1910 and 1920 are representative of two different styles of LED packages; however, the style of package is not a limitation of the present invention and in other embodiments other styles of packages may be used. Contacts 1930 may be electrically coupled to conductive traces 1110 using a variety of means, for example wire bonding, conductive adhesive, solder, eutectic bonding, conductive epoxy, ACA, ACF, or the like. This approach of using packaged LEDs may also be used in other embodiments of this invention, for example those associated with FIG. 4 or 11.

In some embodiments, a LEE unit, for example 1410 or 1420 in FIG. 14, may be faulty and this fault may be found during or after the manufacturing process thereof. A fault may be, for example, an open circuit, a short circuit or an intermittent connection. When LEEs 130 are formed with one or more LEEs on each of multiple substrates, replacement of the faulty units may be carried out more easily than if all of the LEE were on a single substrate, by removing or bridging the faulty unit. Exemplary such "rework" techniques are detailed below.

Figure 20:
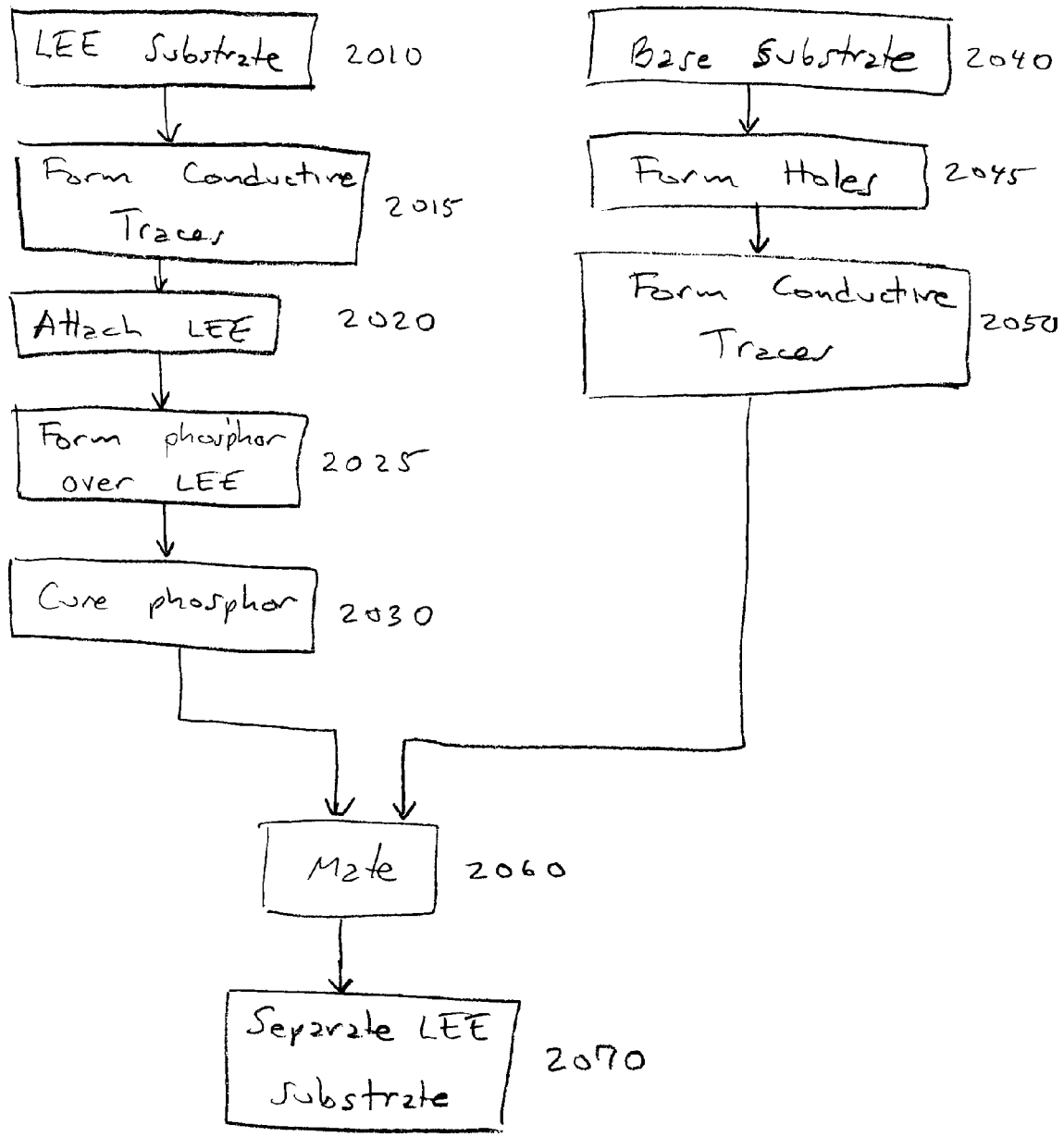
FIG. 20 is a flow chart of another embodiment of the present invention.

FIG. 20 is a general flow chart of a process used to make one embodiment of the structure discussed above with reference to FIG. 16. The process starts with the provision of the LEE substrate in step 2010. Conductive traces 430 are formed over LEE substrate 110 in step 2015. LEEs 130 are formed over (and electrically coupled to) conductive traces 430 in step 2020. Step 2020 may include or consist essentially of the use of wire bonding, one or more adhesives, for example a conductive adhesive, a conductive epoxy, a non-conductive adhesive or an ACA, or other means of electrically coupling LEE 130 to conductive traces 430. Phosphor (light-conversion material) 1630 is formed over all or portions of LEE 130 in step 2025 and the phosphor is cured in step 2030. In parallel, a second process starts with provision of a base substrate 1610 in step 2040. Holes 1620 are formed in base substrate 1610 in step 2045. Conductive traces 1110 are formed over base substrate 1610 in step 2050. The two processes come together in step 2060 where the structures are mated together, for example as shown with reference to FIG. 16. Step 1060 may include or consist essentially of the use of one or more adhesives, for example a conductive adhesive, a non-conductive adhesive or an ACA, or other means of electrically coupling conductive trances 430 to conductive traces 1110. LEE substrate 110 is separated into sections of LEE substrate 210 in step 2070. In some embodiments the process flow includes additional steps and/or some steps shown in FIG. 20 are omitted and/or the order of the steps is different from that shown in FIG. 20.

In some embodiments, the light-emitting element and/or light-conversion materials are different within one lightsheet (i.e., the finished product including one or more LEEs on substrates 210 attached to a substrate 1610). For example, a lightsheet may include a plurality of light-emitting elements, each emitting at substantially the same wavelengths, but different composition, concentration or thickness light-conversion materials may be associated with different portions of the light-emitting elements. In one embodiment a yellow-emitting phosphor and a red-emitting phosphor may be formed in different groups of wells to provide improved color temperature and CRI and uniformity of color temperature and CRI. In one embodiment, a lightsheet includes a plurality of light-emitting elements that are divided into groups, and each group emits light of a different wavelength. For example, in one embodiment, a first group of light-emitting elements emits in the red wavelength range and a second group of light-emitting elements emits in the blue wavelength range. In one embodiment, a first group of light-emitting elements is optically coupled with a light-conversion material while a second group of light-emitting elements is not optically coupled with a light-conversion material.

In some embodiments all or portions of the process are performed in a roll-to-roll process, in which a sheet of the substrate material travels through different processing stations. Such roll-to-roll processing may, for example, include the formation of conductive traces 420 or 430, dispensing of the adhesive, and the placement of LEEs 130. In addition, other passive and/or active electronic devices may be attached to substrate 1530, including, e.g., sensors, antennas, resistors, inductors, capacitors, thin-film batteries, transistors and/or integrated circuits. Such other passive and/or active electronic devices may be electrically coupled to conductive traces 420 or 430 or LEE 130 with adhesive (610 and/or 620) or by other approaches. In some embodiments, LEEs 130 include other devices, for example sensors, antennas, resistors, inductors, capacitors, thin-film batteries, transistors and/or integrated circuits.

In general in the above discussion the arrays of light emitters, wells, optics and the like have been shown as square or rectangular arrays; however, this is not a limitation of the present invention and in other embodiments these elements are formed in other types of arrays, for example hexagonal, triangular or any arbitrary array. In some embodiments these elements are grouped into different types of arrays on a single substrate.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method of forming an illumination system, the method comprising:
   providing a monolithic lightsheet comprising a support substrate and defining a plurality of lighting units each comprising (i) a portion of the support substrate, (ii) a plurality of electrical traces disposed thereon, and (iii) one or more light-emitting elements electrically coupled to the electrical traces;
   mating the lightsheet to an optical substrate comprising a plurality of wells therein such that (i) each of a first plurality of lighting units is aligned with a well such that the one or more light-emitting elements of the lighting unit are disposed within the well, and (ii) a second plurality of lighting units are each disposed between wells such that the light-emitting elements thereof are not disposed within a well; and
   removing each of the second plurality of lighting units from the optical substrate, the first plurality of lighting units remaining mated to the optical substrate.

2. The method of claim 1, further comprising:
   after removing each of the second plurality of lighting units from the optical substrate, mating the second plurality of lighting units to the optical substrate such that (i) each of a third plurality of lighting units is aligned with a well such that the one or more light-emitting elements of the lighting unit are disposed within the well, and (ii) a fourth plurality of lighting units are each disposed between wells such that the light-emitting elements thereof are not disposed within a well; and
   removing each of the fourth plurality of lighting units from the optical substrate, the third plurality of lighting units remaining mated to the optical substrate.

3. The method of claim 2, further comprising, after removing each of the fourth plurality of lighting units from the optical substrate, mating the fourth plurality of lighting units to the optical substrate such that each of a fourth plurality of lighting units is aligned with a well such that the one or more light-emitting elements of the lighting unit are disposed within the well.

4. The method of claim 1, further comprising, after removing each of the second plurality of lighting units from the optical substrate, mating the second plurality of lighting units to the optical substrate such that each of a second plurality of lighting units is aligned with a well such that the one or more light-emitting elements of the lighting unit are disposed within the well.

5. The method of claim 1, wherein the optical substrate defines a plurality of optical elements.

6. The method of claim 5, wherein each of the wells of the optical substrate is aligned with at least one of the optical elements.

7. The method of claim 5, wherein each of the optical elements is aligned with at least one well of the optical substrate.

8. The method of claim 1, wherein, prior to mating the lightsheet to the optical substrate, one or more of the wells comprises a light-conversion material therewithin.

9. The method of claim 1, wherein (i) the optical substrate comprises a plurality of electrical conductors thereon prior to mating of the lightsheet to the optical substrate, and (ii) mating the lightsheet to the optical substrate comprises electrically coupling each electrical trace to an electrical conductor.

10. The method of claim 1, wherein, prior to mating of the lightsheet to the optical substrate, the lightsheet is partially separated along lines disposed between the lighting units.

11. The method of claim 1, wherein, prior to mating of the lightsheet to the optical substrate, the lightsheet comprises a light-conversion material disposed over at least one light-emitting element.

12. The method of claim 1, wherein the light-emitting elements of the lightsheet are spaced apart from each other with a spacing ranging from approximately 2 mm to approximately 50 mm.

13. The method of claim 12, wherein a spacing of the wells of the optical substrate is an integer multiple of the spacing of the light-emitting elements.

14. The method of claim 1, further comprising electrically testing at least some of the light-emitting elements before mating the lightsheet to the optical substrate.

15. The method of claim 14, wherein electrically testing at least some of the light-emitting elements identifies one or more light-emitting elements that are non-functional or out of specification, and wherein mating the lightsheet to the optical substrate comprises aligning the lightsheet with the optical substrate such that at least one of the light-emitting elements that are non-functional or out of specification is disposed within the second plurality of lighting units.

16. The method of claim 1, wherein a sidewall of at least one of the wells is reflective to a wavelength of light emitted by the light-emitting elements.

17. The method of claim 1, wherein mating the lightsheet to the optical substrate comprises adhering the first plurality of lighting units to the optical substrate with an adhesive.

18. The method of claim 1, wherein the support substrate is flexible.

19. The method of claim 1, wherein the support substrate comprises at least one of polyethylene naphthalate, polyethylene terephthalate, acrylic, polycarbonate, polyethersulfone, polyester, polyimide, polyethylene, or paper.

20. The method of claim 1, wherein the optical substrate is flexible.

* * * * *